US011296687B2

(12) United States Patent
Nuttgens (10) Patent No.: US 11,296,687 B2
(45) Date of Patent: *Apr. 5, 2022

(54) FEED-FORWARD CURRENT COMPENSATION FOR CMOS SIGNAL PATH

(71) Applicant: Semtech Corporation, Camarillo, CA (US)

(72) Inventor: Jonah Edward Nuttgens, Southampton (GB)

(73) Assignee: Semtech Corporation, Camarillo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/000,557

(22) Filed: Aug. 24, 2020

(65) Prior Publication Data

US 2021/0067152 A1 Mar. 4, 2021

Related U.S. Application Data

(63) Continuation of application No. 16/560,583, filed on Sep. 4, 2019, now Pat. No. 10,790,809.

(51) Int. Cl.
| | | |
|---|---|---|
| *H03K 17/042* | (2006.01) | |
| *H03K 17/56* | (2006.01) | |
| *H02M 3/07* | (2006.01) | |
| *G05F 1/10* | (2006.01) | |
| *G11C 11/4074* | (2006.01) | |

(52) U.S. Cl.
CPC ......... *H03K 17/04206* (2013.01); *G05F 1/10* (2013.01); *G11C 11/4074* (2013.01); *H02M 3/07* (2013.01); *H03K 17/56* (2013.01)

(58) Field of Classification Search
None
See application file for complete search history.

(56) References Cited

U.S. PATENT DOCUMENTS

| | | |
|---|---|---|
| 7,521,762 B2 | 4/2009 | Hidaka |
| 9,170,592 B2 | 10/2015 | Seymour et al. |
| 10,067,519 B2 | 9/2018 | Leibowitz et al. |
| 10,326,463 B2 | 6/2019 | Liu et al. |
| 2012/0153909 A1 | 6/2012 | Bucossi et al. |
| 2015/0277462 A1 | 10/2015 | Dhiman et al. |

FOREIGN PATENT DOCUMENTS

WO 2009065050 A1 5/2009

*Primary Examiner* — Jeffery S Zweizig
(74) *Attorney, Agent, or Firm* — Robert D. Atkins; Patent Law Group: Atkins and Associates, P.C.

(57) ABSTRACT

An integrated circuit has a CMOS signal path coupled for receiving a data signal. A compensation circuit is coupled to a power supply rail of the CMOS signal path for injecting a compensation current into the power supply rail. The compensation circuit can be a charge pump operating in response to the data signal to inject the compensation current into the power supply rail each transition of the data signal. The compensation circuit can be a replica CMOS signal path to inject the compensation current into the power supply rail each transition of the data signal. The compensation circuit can be a voltage regulator and current mirror including an input coupled to the voltage regulator. The replica CMOS signal path receives an operating potential from the voltage regulator. An output of the current mirror injects the compensation current into the power supply rail each transition of the data signal.

15 Claims, 4 Drawing Sheets

FEED-FORWARD CURRENT COMPENSATION FOR CMOS SIGNAL PATH

CLAIM OF DOMESTIC PRIORITY

The present application is a continuation of U.S. patent application Ser. No. 16/560,583, now U.S. Pat. No. 10,790,809, filed Sep. 4, 2019, which application is incorporated herein by reference.

FIELD OF THE INVENTION

The present invention relates in general to a CMOS IC and, more particularly, to a feed-forward current compensation scheme for a CMOS signal path.

BACKGROUND OF THE INVENTION

In a complementary metal oxide semiconductor (CMOS) integrated circuit (IC) that handles high-speed serial data, it is efficient to employ CMOS logic-style circuit elements, such as inverters and logic gates, in the high-speed serial data signal path. The supply current for the CMOS logic-style circuitry varies rapidly in response to the logic transitions in the input data.

Figure 1:
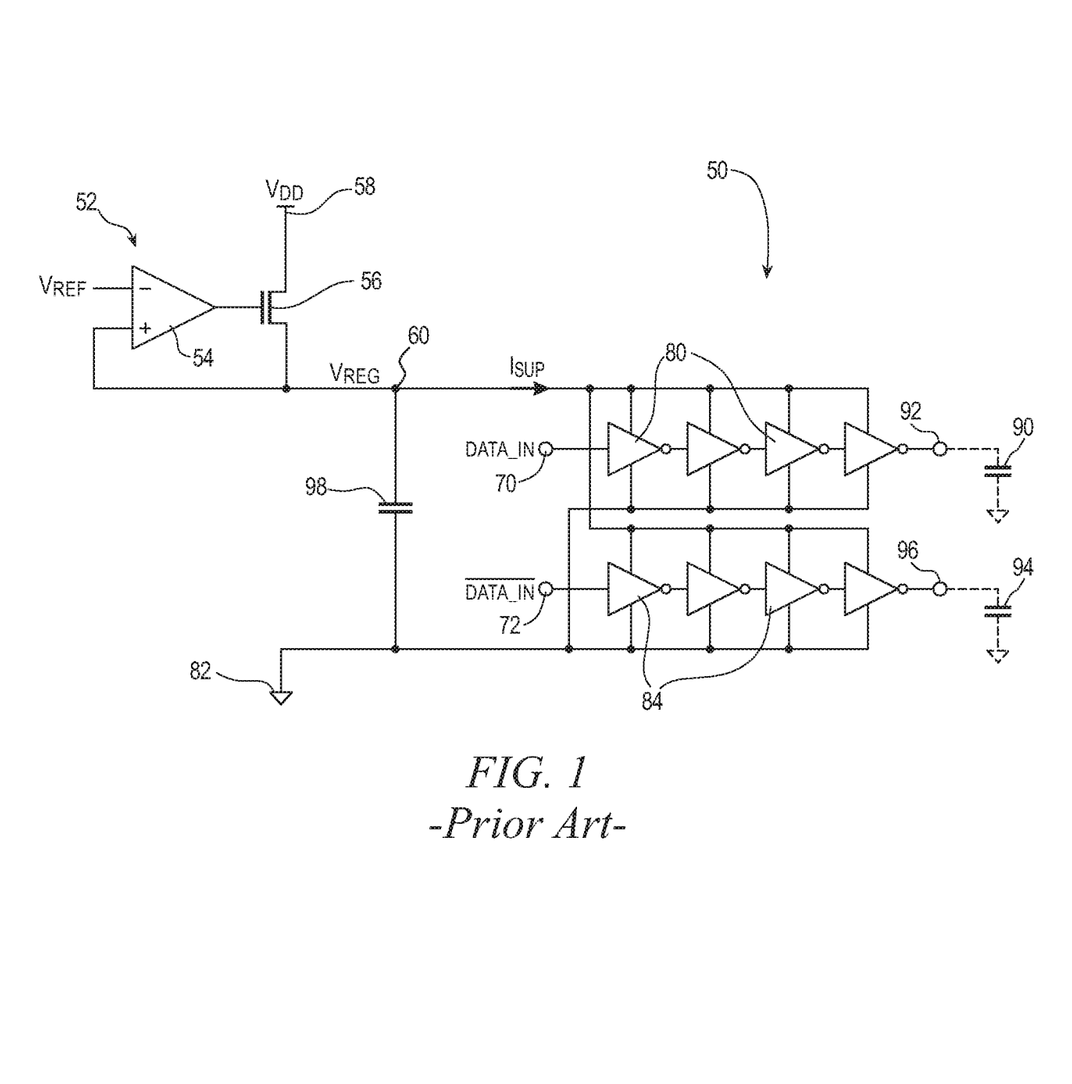
FIG. 1 illustrates a conventional CMOS signal path with voltage regulator.

FIG. 1 illustrates a conventional CMOS signal path 50 propagating high speed serial differential data through an IC. Voltage regulator 52 includes amplifier 54 receiving reference voltage $V_{REF}$ at its inverting input. The output of amplifier 54 is coupled to the gate of transistor 56. The drain of transistor 56 is coupled to power supply conductor 58 operating at a positive potential $V_{DD}$, and the source of transistor 56 is coupled to node 60. The non-inverting input of amplifier 54 is coupled to node 60, which operates as a power supply rail to maintain a regulated output voltage $V_{REG}$. CMOS signal path 50 receives an input data signal DATA IN at terminal 70 and the complement of DATA IN at terminal 72. DATA IN propagates through series-coupled of inverters or buffers 80, which receive positive operating potential from $V_{REG}$ and ground operating potential from power supply conductor 82. The complement of DATA IN propagates through series-coupled inverters or buffers 84, which receive positive operating potential from $V_{REG}$ and ground operating potential from power supply conductor 82. Effective load capacitance 90 is seen on output terminal 92, and effective load capacitance 94 is seen on output terminal 96. Capacitor 98 is coupled between node 60 and power supply conductor 82.

Voltage regulator 52 supplying series inverters 80 and 84 struggles to cope with the large and instantaneous demands for charge from its load. The limited bandwidth of typical regulators and the limited size of the on-chip decoupling capacitor can cause the inability of the regulator to maintain a constant supply voltage with rapid variations in current demand, manifesting as variations in the regulated supply voltage, also known as ripple. The ripple in the supply rail adds to jitter in the output data signal at terminals 92 and 96, since it modulates the propagation delay of CMOS logic circuits. Low jitter is important, particularly with higher data rates. It is desirable to reduce ripple in $V_{REG}$, for high-speed serial data signal path 50 using CMOS logic circuitry, with the objective of reducing jitter in the output signal.

For a signal path having substantial load capacitance, or many stages, and/or operating at high data rates, the absolute supply current $I_{SUP}$ can be quite large, and therefore the absolute peak-to-peak variation in short-term supply current consumption can also be substantial. Voltage regulator 52 generating $V_{REG}$ for power supply rail 60 can be internal to the CMOS IC, particularly where the IC contains multiple functions operating at various different supply voltages, or in applications requiring dedicated supplies for noise isolation. If voltage regulator 52 is unable to respond instantaneously to the variation in its load current, the regulated voltage $V_{REG}$ deviates from its nominal value. Short-term variation in the data signal content therefore results in ripple on the supply voltage.

A characteristic of a CMOS logic circuit is that its propagation delay varies with supply voltage. Consequently, if the instantaneous value of supply voltage is varying dependent on the data content, the propagation delay of the CMOS signal path is continuously varying, and this manifests as timing jitter at output terminals 92 and 96 of CMOS signal path 50. For systems processing high speed serial data signals, jitter is exceedingly critical to performance. Therefore, ripple on the supply voltage of CMOS signal path 50 is undesirable.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

A CMOS IC, such as an optical driver, can process high-speed serial data. In terms of area and power consumption of the IC, an efficient and effective approach to processing the serial data signal involves using CMOS logic-style circuit elements, such as inverters and logic gates. The serial data signal could propagate without modification, for example, in a chain of successively larger buffers or inverters designed to boost the drive-strength of the data signal and enable driving of a final large capacitive load, such as the output stage of an optical or line driver. The signal processing could also involve other operations, such as gating, configurable polarity inversion, multiplexing between primary and secondary inputs, circuitry to adjust or manipulate edge timings, data analysis or activity detection, and many other possible functions.

The CMOS signal path includes the CMOS logic-style circuitry through which the primary high-speed serial data input is conveyed, in the normal mission mode of the IC, to one or more outputs or internal loads. In one embodiment, the input to the signal path is commonly in the form of a differential pair of complementary signals, in which case the signal path may contain two substantially identical parallel paths, each conveying one half of the complementary pair. The differential paths improve the symmetry of the overall circuit response to rising and falling edges of the input data signal.

Figure 2:
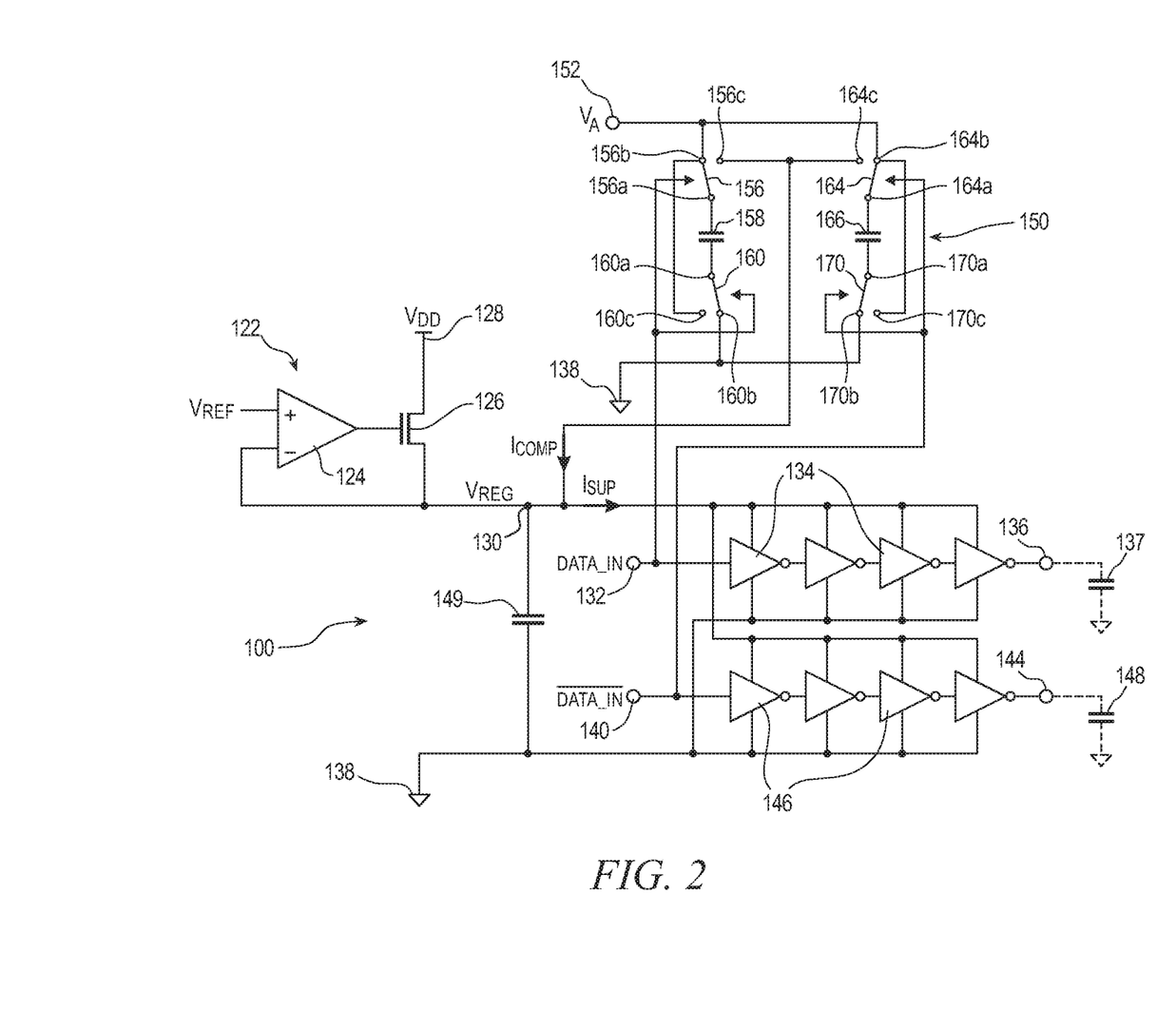
FIG. 2 illustrates a CMOS signal path with a charge pump providing compensation current to a supply rail.

FIG. 2 illustrates CMOS signal path 100 propagating high speed, e.g. 10 Gb/second or higher, serial differential data through an IC. Voltage regulator 122 can be internal to the CMOS IC and includes amplifier 124 receiving reference voltage $V_{REF}$ at its non-inverting input. The output of amplifier 124 is coupled to the gate of transistor 126. The drain of transistor 126 is coupled to power supply conductor 128 operating at a positive potential $V_{DD}$, and the source of transistor 126 is coupled to node 130. The inverting input of amplifier 124 is coupled to node 130 to maintain a regulated output voltage $V_{REG}$ on node 130, operating as a power supply rail for inverters 134 and 146, e.g., 1-2 volts. CMOS signal path 100 receives an input data signal DATA IN at terminal 132 and the complement of DATA IN at terminal 140. DATA IN propagates through successively larger series-coupled inverters or buffers 134, which receive positive operating potential from $V_{REG}$ and ground operating potential from power supply conductor or rail 138. The complement of DATA IN propagates through successively larger series-coupled inverters or buffers 146, which receive positive operating potential from $V_{REG}$ and ground operating potential from power supply conductor 138. Effective load capacitance 137 is seen on output terminal 136, and effective load capacitance 148 is seen on output terminal 144. Capacitor 149 is coupled between node 130 and power supply conductor 138.

CMOS signal path 100 exhibits a rapidly varying demand for current from the supply rail, i.e., node 130. The operation of CMOS signal path 100 involves bursts of charge from supply rail 130 when a bit transition of DATA IN and its complement DATA IN occur. For example, with inverters 134 and 146 driving a sizeable capacitive load, when the input changes state from logic zero to logic one, a supply current $I_{SUP}$ is drawn from supply rail 130 to charge the capacitive load. If the transition is not instantaneous, as is usually the case, large shoot-through currents also flow from supply rail 130 for the period when both the NMOS and PMOS transistors of inverters 134 and 146 are conducting at the same time. For larger chains of inverters and logic circuits, each intermediate node along the signal path also toggles its state at each transition of the data input. The supply current $I_{SUP}$ demand for the signal path circuitry can be approximated as a packet of charge Q at each transition of the input data state. For a symmetrical complementary signal path, the charge Q drawn from the supply is substantially identical for both directions of input logic state transition. The charge Q drawn from supply rail 130 is the integral of the supply current $I_{SUP}$ over time.

The duration of the pulse of current will, in practice, be related to the propagation delay of the signal path. For high data rates and signal paths containing several stages, the propagation delay may exceed the bit period, and the supply current pulses due to successive data transitions may overlap. However, the total charge, and therefore the average current, drawn from supply rail 130 by the signal path over any reasonable period of time remains substantially proportional to the number of data transitions occurring during that period. For typical serial data signals having a degree of randomness, the short-term transition density can vary significantly. There are also periods in which the data contains many transitions, e.g., 01010101, and other periods of multiple consecutive identical digits (CIDs), e.g., 11111111, containing few or no transitions. Therefore, supply current $I_{SUP}$ drawn by CMOS signal path 100 can exhibit significant short-term variation.

For CMOS signal path 100 having a primary data input which the circuit must convey, its supply current demand can be approximated as a packet of charge drawn from node 130 at each transition of the input data value. The continuously varying data content leads to short-term variations in supply current demand, causing supply voltage ripple due to the finite AC impedance of node 130.

The supply current $I_{SUP}$ provided by voltage regulator 122 is decoupled by reservoir capacitor 149. Voltage regulator 122 is a linear voltage regulator with a negative feedback loop, which continuously monitors its output voltage and controls pass transistor 126 to maintain the desired value $V_{REG}$. The feedback loop has a finite bandwidth and voltage regulator 122 cannot respond instantaneously to rapid changes in load current. The output of voltage regulator 122 is stabilized by a large decoupling or reservoir capacitor 149, which helps to smooth out the short-term variations in load current.

In the case of high-speed serial data signals, the nominal response time of voltage regulator 122 may be many times longer than the data bit period. Therefore, if the data content suddenly demands a large increase in supply current $I_{SUP}$, it may be many bit-periods before the voltage regulator responds appreciably. In the meantime, the supply current $I_{SUP}$ is predominantly supplied by reservoir capacitor 149. The charge stored on capacitor 149 decreases, causing the supply voltage $V_{REG}$ to drop momentarily. Conversely, if a period of frequent data transitions is followed by long sequence of CIDs, voltage regulator 122 may continue to supply a surplus of current for a short time. Reservoir capacitor 149 absorbs the excess current, causing $V_{REG}$ to exceed the nominal value.

The conventional solution to reducing supply voltage ripple is to increase the value of the reservoir capacitor. Unfortunately, if internal to the IC, a larger reservoir capacitor may consume a large area of the chip. The ripple may also be reduced by increasing the regulator feedback loop bandwidth, but this generally requires an increase in power consumption. Either way, the original advantages of using CMOS logic-style circuitry for implementing a high-speed serial data signal path are diminished.

The proposed solution as described herein is to reduce the magnitude of ripple on power supply rail 130 by supplying a packet of charge onto supply rail 130 at each transition of DATA IN, i.e., feed-forward compensation. The packet of charge introduced should be approximately equal to the charge Q consumed by CMOS signal path 100. The feed-forward compensation system for the varying load current on supply rail 130, works with the feedback compensation provided by voltage regulator 122. The feed-forward system is able to compensate for the varying supply current of CMOS signal path 100 much more quickly than voltage regulator 122 alone, since it anticipates the arrival of the load current spike by responding to DATA IN, whereas the conventional voltage regulator can only respond retrospectively. The magnitude of charge supplied by the feed-forward system is approximately matched by the charge drawn by the signal path. Any error in the feed-forward current is corrected by voltage regulator 122. Provided that the feed-forward compensation is reasonably accurate, the net charge flowing in and out of reservoir capacitor 149, and being supplied by voltage regulator 122, is significantly reduced. The voltage ripple on power supply rail 130 is also reduced, providing a corresponding improvement in jitter performance of CMOS signal path 100.

The precise timing and shape of the waveform delivered by the feed-forward compensation circuit is also not critical, since the reservoir capacitor can quite easily supply or absorb any temporary deficit or surplus of charge occurring during the very short time that a data transition is propagating through the signal path. Unlike the system having a conventional voltage regulator alone, such a deficit or surplus of charge does not accumulate over multiple bit-periods.

In one embodiment, to implement feed-forward compensation and provide the packet of charge to compensate for variation in supply current during high speed operation and varying loads, charge pump circuit 150 injects compensation current $I_{COMP}$ to node 130 in response to transitions on DATA IN. Charge pump circuit 150 includes a first cell with switching circuits 156 and 160 and capacitor 158. Terminal 156a of switching circuit 156 is coupled to a first terminal of capacitor 158. Terminal 156b of switching circuit 156 is coupled to power supply conductor 152 operating at a positive potential $V_A$. Terminal 156c of switching circuit 156 is coupled to node 130. Terminal 160a of switching circuit 160 is coupled to a second terminal of capacitor 158. Terminal 160b of switching circuit 160 is coupled to power supply conductor 138. Terminal 160c of switching circuit 160 is coupled to power supply conductor 152. The power supply $V_A$ for the charge pumps may be supplied from a separate voltage regulator (not shown). The magnitude of ripple on $V_A$ is less important than that on $V_{REG}$, so $V_A$ can potentially be generated from a much simpler voltage regulator, with a relatively small decoupling capacitor.

Charge pump circuit 150 further includes a second cell with switching circuits 164 and 170 and capacitor 166. Terminal 164a of switching circuit 164 is coupled to a first terminal of capacitor 166. Terminal 164b of switching circuit 164 is coupled to power supply conductor 152. Terminal 164c of switching circuit 156 is coupled to node 130. Terminal 170a of switching circuit 170 is coupled to a second terminal of capacitor 166. Terminal 170b of switching circuit 170 is coupled to power supply conductor 138. Terminal 170c of switching circuit 170 is coupled to power supply conductor 152. The power supply $V_A$ for the charge pumps may be supplied from a separate voltage regulator (not shown).

Charge pump 150 delivers a defined quantity of charge onto supply rail 130 at each transition of DATA IN and its complement. When DATA IN is logic one, terminal 156a is connected to terminal 156b and terminal 160a is connected to terminal 160b. Capacitor 158 ($C_{158}$) is charged by $V_A$ to $Q=C_{158}*V_A$. In the opposite phase, DATA IN is logic zero and terminal 156a is connected to terminal 156c and terminal 160a is connected to terminal 160c. Capacitor 158 is coupled between $V_A$ to node 130. The terminal voltage of capacitor 158 changes to $(V_{REG}-V_A)$, providing $\Delta Q=C_{158}*(2V_A-V_{REG})$ to node 130 as current pulse $I_{COMP}$. In one embodiment, $V_A=V_{REG}$ and $\Delta Q=C_{158}*V_A$. The first and second charge pump cells are locked on opposite phases of DATA IN, and summed to generate a pulse of current $I_{COMP}$ on both rising and falling edges of the data signal.

The values of capacitor 158 and capacitor 166, as well as $V_A$, are chosen such that the compensation packet of charge $\Delta Q$, as delivered by charge pump 150, is approximately equal to the charge consumed from supply rail 130 by CMOS signal path 100 at each data transition. The net charge flow in and out of reservoir capacitor 149 is reduced, and voltage regulator 122 need to supply a relatively small current to overcome any mismatch between the average values of $I_{SUP}$ and $I_{COMP}$. The value of reservoir capacitor 149 is much larger than the value of capacitors 158 and 166, ensuring that any temporary mismatch between the charge consumed by CMOS signal path 100 and the charge delivered by charge pump 150 causes minimal disturbance to $V_{REG}$. The feed-forward compensation with charge pump 150 significantly reduces supply ripple and jitter in CMOS signal path 100, without the need for a large area increase of reservoir capacitor 149.

The simplified, conceptual voltage regulator 122 depicted in FIG. 2 is capable only of sourcing current into its load, but cannot sink current, and therefore can correct one polarity of mismatch between $I_{SUP}$ and $I_{COMP}$. Accordingly, capacitors 158 and 166 can be chosen so that $I_{COMP}$ is always on average smaller than $I_{SUP}$. Alternatively, a constant current sink could be applied to the output of voltage regulator 122. In another embodiment, voltage regulator 122 uses a push-pull output stage, equally capable of sourcing or sinking output current, and able to correct $I_{COMP}$ and $I_{SUP}$ mismatch of either polarity.

Figure 3:
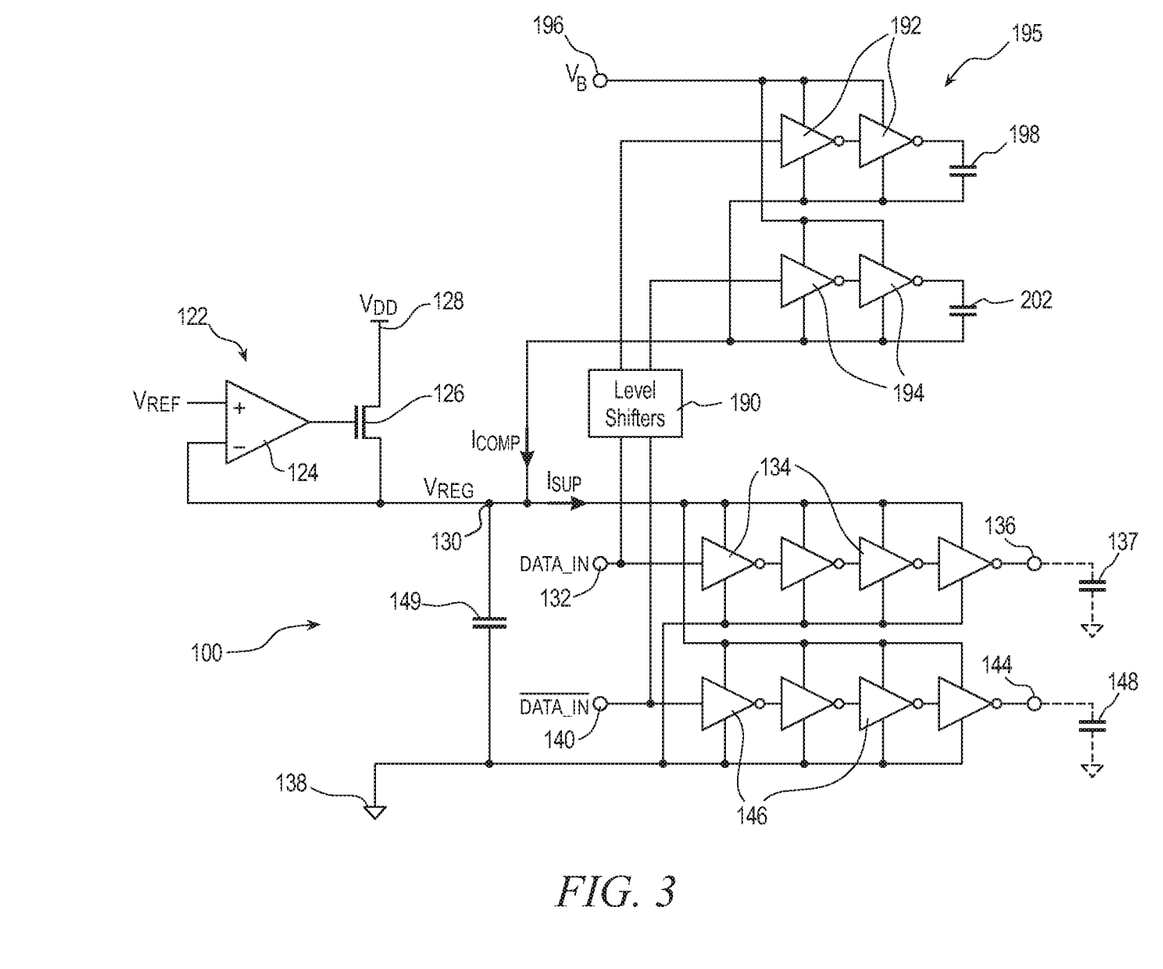
FIG. 3 illustrates a CMOS signal path with another compensation circuit providing compensation current to a supply rail.

FIG. 3 illustrates another implementation of feed-forward compensation. CMOS signal path 100 is provided as described in FIG. 2. Elements with the same reference number perform a similar function. DATA IN and its complement are coupled to inputs of level shifter 190. The outputs of level shifter 190 are coupled to the input of series inverters or buffers 192 and series inverters or buffers 194 as part of compensation circuit 195. Compensation circuit 195 is effectively stacked on CMOS signal path 100, such that the current in the negative supply of compensation circuit 195 flows directly into the positive supply of CMOS signal path 100. Level shifter 190 translate the logic levels of DATA IN and its complement to switch series inverters 192 and 184 between $V_B$ and $V_{REG}$. For example, if inverters 136 and 144 operate logic zero at 0 volts and logic one at 1 volt, then level shifter 190 causes inverters 192 and 194 to operate logic zero at 1 volt and logic one at 2 volts. Inverters 192 and 194 receive operating potential from power supply conductor 196 operating at $V_B$ approximately equal to $2*V_{REG}$. The series inverters 192 and 194 contain enough logic stages and enough load capacitance to match its supply current demand to that of CMOS signal path 100.

Compensation circuit 195 is effectively a replica of CMOS signal path 100, in the respect that it mimics the dynamic supply current consumption of CMOS signal path 100 and provides charge packets to node 130 at each transition of DATA IN and its complement. Compensation circuit 195 consumes substantially the same amount of charge per data transition as CMOS signal path 100. The charge is drawn initially from the $V_B$ rail and is commutated to supply rail 130 to compensate the equivalent amount of charge drawn by CMOS signal path 100. The net load current on voltage regulator 122 is substantially reduced, as well as the amplitude of ripple on $V_{REG}$.

One advantage of compensation circuit 195 is the use of similar logic-style elements as CMOS signal path 100. The supply current dependence on temperature and other variables tend to track that of CMOS signal path 100. The accuracy of compensation is improved over the range of operating conditions and manufacturing process variation. The accuracy of tracking can be optimized by adjusting the relative load capacitance and transistor sizes in the logic elements of compensation circuit 195, to control the relative contributions of capacitive charge-pumping effects and CMOS logic shoot-through currents to the total compensation current.

Figure 4:
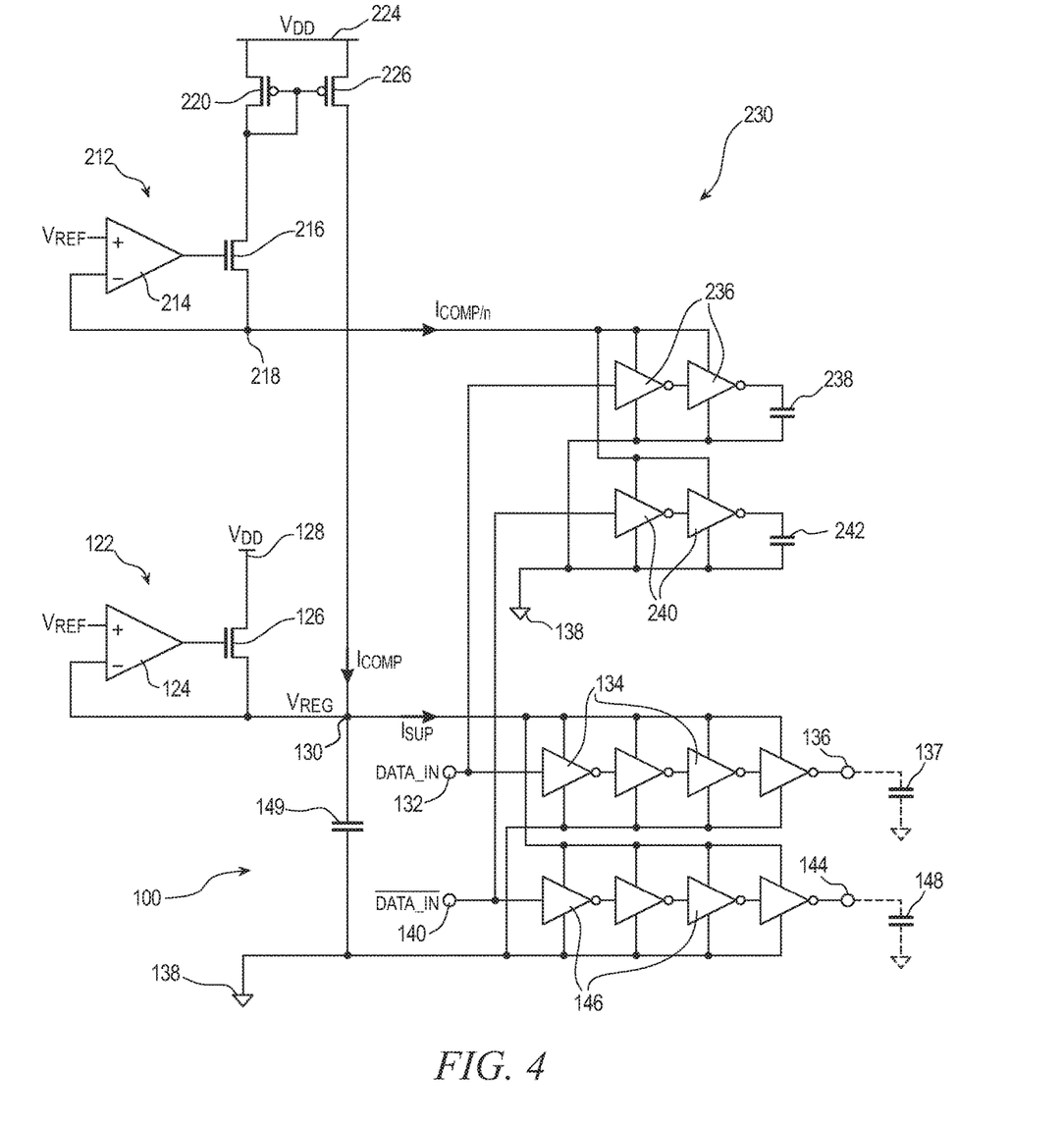
FIG. 4 illustrates a CMOS signal path with another compensation circuit providing compensation current to a supply rail.

FIG. 4 illustrates another implementation of feed-forward compensation. CMOS signal path 100 is provided as described in FIG. 2. Elements with the same reference number perform a similar function. Voltage regulator 212 includes amplifier 214 receiving reference voltage $V_{REF}$ at its non-inverting input. The output of amplifier 214 is coupled to the gate of transistor 216. The source of transistor 216 is coupled to the inverting input of amplifier 214 at node 218. The drain of transistor 216 is coupled to PMOS transistors 220 and 226, arranged as a current mirror with a 1:n ratio. The drain of transistor 226 is coupled to node 130 to provide compensation current ICOMP to node 130, operating as a power supply rail for inverters 134 and 146, e.g., 1-2 volts.

DATA IN is coupled to the input of series inverters or buffers 236, the complement of DATA IN is coupled to the input of series inverters or buffers 240 as part of compensation circuit 230. Inverters 236 and 240 receive operating potential from node 218. The compensation circuit 230 may include load capacitors 238 and 242 at the outputs of series inverters 236 and 240. The series inverters 236 and 240, with their load capacitances, represent a scaled-down replica of the CMOS signal path 100, in respect of their dynamic supply current, and are sized so that their supply current demand (ICOMP/n) is a fraction 1/n of that of CMOS signal path 100.

Compensation circuit 230 uses separate voltage regulator 212. The supply current of the scaled replica signal path ICOMP/n is sensed and re-scaled through current mirror 220-226 with a ratio 1:n to generate $I_{COMP}$ to node 130. Compensation circuit 230 mimics the dynamic supply current consumption of CMOS signal path 100 and provides charge packets to node 130 at each transition of DATA IN and its complement. The net load current on voltage regulator 122 is substantially reduced, as well as the amplitude of ripple on $V_{REG}$.

In summary, a compensation circuit has been shown in a variety of embodiments of FIGS. 2-4 to generate $I_{COMP}$ to match the transient behavior of $I_{SUP}$ and reduce disturbance and ripple on the regulated supply $V_{REG}$. The compensation reduces jitter on the output of CMOS signal path 100 and maintains a constant, stable, isolated, and dedicated supply voltage to series inverters 134 and 146.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a CMOS signal path including an input coupled for receiving a data signal from a data terminal;
   a replica CMOS signal path including an input coupled for receiving the data signal and further including an output responsive to the data signal to source a feed-forward compensation current into a first power supply rail of the CMOS signal path each transition of the data signal, wherein a packet of charge provides the feed-forward compensation current equal and opposite to an anticipated variation in supply current of the CMOS signal path in response to each transition of the data signal; and
   providing a voltage regulator coupled to the power supply rail of the CMOS signal path to provide a balance of supply current, comprising any mismatch between the supply current of the CMOS signal path and the feed-forward compensation current.

2. The semiconductor device of claim 1, wherein the CMOS signal path includes a plurality of serially coupled buffers or inverters.

3. The semiconductor device of claim 1, wherein the replica CMOS signal path includes a plurality of serially coupled buffers or inverters.

4. The semiconductor device of claim 1, further including a level shifter coupled between the data terminal and the input of the replica CMOS signal path.

5. The semiconductor device of claim 1, further including a capacitor coupled between the first power supply rail of the CMOS signal path and a second power supply rail of the CMOS signal path.

6. A semiconductor device, comprising:
   a CMOS signal path including an input coupled for receiving a data signal from a data terminal;
   a compensation circuit coupled to a power supply rail of the CMOS signal path and responsive to the data signal for injecting a feed-forward compensation current into the power supply rail each transition of the data signal, wherein a packet of charge provides the feed-forward compensation current equal and opposite to an anticipated variation in supply current of the CMOS signal path in response to each transition of the data signal; and
   a voltage regulator coupled to the power supply rail of the CMOS signal path to provide a balance of supply current, comprising any mismatch between the supply current of the CMOS signal path and the feed-forward compensation current.

7. The semiconductor device of claim 6, wherein the compensation circuit includes a replica CMOS signal path including an input coupled for receiving the data signal and an output providing the feed-forward compensation current into the power supply rail of the CMOS signal path each transition of the data signal.

8. The semiconductor device of claim 7, wherein the replica CMOS signal path includes a plurality of serially coupled buffers or inverters.

9. The semiconductor device of claim 7, further including a level shifter coupled between the data terminal and the input of the replica CMOS signal path.

10. The semiconductor device of claim 6, wherein the compensation circuit includes:
    a replica CMOS signal path including an input coupled for receiving the data signal;
    a first voltage regulator including an output coupled to a power supply rail of the replica CMOS signal path, wherein the first voltage regulator includes a transistor with a first conduction terminal coupled to the output of the first voltage regulator; and
    a current mirror including an input coupled to a second conduction terminal of the transistor and an output injecting the feed-forward compensation current into the power supply rail of the CMOS signal path each transition of the data signal.

11. A method of making an integrated circuit, comprising:
    providing a CMOS signal path including an input coupled for receiving a data signal from a data terminal;
    providing a compensation circuit coupled to a power supply rail of the CMOS signal path and responsive to the data signal for injecting a feed-forward compensation current into the power supply rail each transition of the data signal, wherein a packet of charge provides the feed-forward compensation current equal and opposite to an anticipated variation in supply current of the CMOS signal path in response to each transition of the data signal; and providing a voltage regulator coupled to the power supply rail of the CMOS signal path to provide a balance of supply current, comprising any mismatch between the supply current of the CMOS signal path and the feed-forward compensation current.

12. The method of claim 11, wherein providing the compensation circuit includes providing a replica CMOS signal path including an input coupled for receiving the data signal and an output providing the feed-forward compensation current into the power supply rail of the CMOS signal path each transition of the data signal.

13. The method of claim 12, wherein providing the replica CMOS signal path includes providing a plurality of serially coupled buffers or inverters.

14. The method of claim 12, further including providing a level shifter coupled between the data terminal and the input of the replica CMOS signal path.

15. The method of claim 11, wherein the compensation circuit includes:

providing a replica CMOS signal path including an input coupled for receiving the data signal;

providing a first voltage regulator including an output coupled to a power supply rail of the replica CMOS signal path, wherein the first voltage regulator includes a transistor with a first conduction terminal coupled to the output of the first voltage regulator; and providing a current mirror including an input coupled to a second conduction terminal of the transistor and an output injecting the feed-forward compensation current into the power supply rail of the CMOS signal path each transition of the data signal.

\* \* \* \* \*

UNITED STATES PATENT AND TRADEMARK OFFICE
CERTIFICATE OF CORRECTION

PATENT NO. : 11,296,687 B2
APPLICATION NO. : 17/000557
DATED : April 5, 2022
INVENTOR(S) : Jonah Edward Nuttgens It is certified that error appears in the above-identified patent and that said Letters Patent is hereby corrected as shown below:

In the Claims

Column 7, Claim 1, Line 63, delete the word, "providing" before the words, "a voltage regulator coupled to the power supply"

Signed and Sealed this
Twelfth Day of July, 2022

Katherine Kelly Vidal
Director of the United States Patent and Trademark Office